United States Patent [19]
Hirose et al.

[11] Patent Number: 5,770,861
[45] Date of Patent: Jun. 23, 1998

[54] APPARATUS FOR WORKING A SPECIMEN

[75] Inventors: Hiroshi Hirose, Hitachinaka; Setsuo Nomura, Tokyo., both of Japan

[73] Assignee: Hitachi, Ltd., Tokyo, Japan

[21] Appl. No.: 733,839

[22] Filed: Oct. 18, 1996

[30] Foreign Application Priority Data

Oct. 20, 1995 [JP] Japan ................................ 7-272287

[51] Int. Cl.⁶ ............................................. H01J 37/26
[52] U.S. Cl. ...................... 250/310; 250/306; 250/307; 250/492.21
[58] Field of Search .................... 250/310, 492.21, 250/311, 306, 307, 492.2, 492.3

[56] References Cited

U.S. PATENT DOCUMENTS

| | | | |
|---|---|---|---|
| 4,740,698 | 4/1988 | Tamura et al. ........................... | 250/310 |
| 5,057,689 | 10/1991 | Nomura et al. ......................... | 250/310 |
| 5,233,191 | 8/1993 | Noguchi et al. ........................ | 250/310 |
| 5,412,210 | 5/1995 | Todokoro et al. ....................... | 250/310 |
| 5,525,806 | 6/1996 | Iwasaki et al. ......................... | 250/310 |
| 5,576,542 | 11/1996 | Kaga ....................................... | 250/310 |
| 5,594,245 | 1/1997 | Todokoro et al. ....................... | 250/310 |

OTHER PUBLICATIONS

"Bunseki", 1989, No. 1, by Japan Society of Analytical Chemistry, pp. 48–60.

*Primary Examiner*—Kiet T. Nguyen
*Attorney, Agent, or Firm*—Kenyon & Kenyon

[57] ABSTRACT

An apparatus for producing a highly accurate three-dimensional image of a solid in the micro order is provided. The apparatus is composed of an ion column, an electron column, a specimen chamber, a specimen stage, a diluent gas ion column, a control system, and so on. The apparatus has the following advantages: (1) correct three-dimensional information can be provided even if a specimen is composed of composite materials; (2) since a worked dimension can be accurately measured, highly accurate three-dimensional observation can be achieved in the micron order; (3) since a plurality of images can be stored for an observed surface, a plurality of three-dimensional images can be produced from a single specimen; and (4) since a side entry stage is employed as a specimen stage, a working column and an observation column can be positioned close to a specimen, so that beams from the respective columns can be well converged, thus making it possible to produce highly accurate three-dimensional images.

18 Claims, 3 Drawing Sheets

APPARATUS FOR WORKING A SPECIMEN

BACKGROUND OF THE INVENTION

The present invention relates to an apparatus which works a stack structure, such as a solid-state device or the like, using an ion beam to restore its structure and composition.

Conventional FIB apparatus has been typically used to store data in a direction in which a specimen is sputtered with an ion beam, as described, for example, in "Bunseki", 1989, No. 1, published by Japan Society of Analytical Chemistry. In this case, for identifying a working depth, time is used. Therefore, correct information on depth cannot be provided when a stack structure includes an easily sputtered layer and a difficultly sputtered layer. Also, when a specimen having a rugged surface is sputtered, a worked surface is uneven in an earlier stage but gradually becomes flat due to an incident angle dependency of the sputtering. Thus, also from this point of view, it cannot be said that the accuracy in the depth direction is sufficient. Further, since the resolution of an image resulting from the analysis depends on the diameter of a working beam, a sufficiently high resolution cannot be provided. Specifically, when a larger current is supplied to increase a working rate, the beam diameter disadvantageously becomes larger, due to the characteristic of the beam, to reduce the image resolution. Furthermore, since a conventional method fetches data simultaneously with the working, several drawbacks are brought about. For example, a resulting image cannot be checked midway during working, an observation scale cannot be changed arbitrarily, and so on.

In the prior art as mentioned above, it is impossible to identify which materials exist in which portion of a specimen under analysis because of a poor accuracy of various analytical parameters.

SUMMARY OF THE INVENTION

It is an object of the present invention to provide an apparatus for working a specimen, suitable for use in an apparatus comprising working means particularly as represented by an ion beam and observing means for observing a portion worked by the working means, which is capable of identifying which materials exist in which portion of a specimen under analysis, even with a hardware configuration similar to that of the prior art mentioned above.

The present invention observes a process in which a specimen is worked by working means, using observing means, to identify which materials exist in which portion of the specimen. More specifically, the working means sequentially sputters a portion to be worked of a specimen under analysis over an arbitrary working thickness, and the observing means sequentially observes the sputtered surface to produce a plurality of two-dimensional images. Then, the two-dimensional images are three-dimensionally positioned or combined to produce three-dimensional images. Further, by addionally providing a step of modifying each of the plurality of two-dimensional images thus produced, more accurate three-dimensional images can be produced.

In the present invention, since information for a plurality of images can also be stored for the same position, a plurality of three-dimensional images modified in different manners can be produced in a single step.

Since the working is repeated in the present invention, a worked surface is highly susceptible to contamination, and even if the worked surface is once purged, the worked surface is again contaminated in the next working step. To solve this problem, a purging step is provided between a working step and an observation step to allow an operator to always observe a purged worked surface.

A first energy beam (ion beam), serving as the working means of the present invention, sputters a specimen over an area XxD. In this event, assuming that a working direction is Y, the first energy beam is stopped after a working amount in the Y-direction has reached a certain value.

A second energy beam (electron beam) is oriented substantially perpendicularly to an X-Y plane. A charged particle beam is irradiated in this direction such that image information is obtained from particles interacting with a worked surface irradiated with the charged particle beam. When image information presents a bad contrast, image processing is performed on the image information. This image is stored together with depth information D. The depth information is calculated from the power for converging an energy beam for observing an image, i.e., the current flowing through a coil for moving an objective lens which provides the best image in the case of a scanning electron microscope. If the best point cannot be determined with the naked eye, a secondary electron signal is differentiated in a plane direction, and the point at which the differentiated value is maximum is found. This step is performed before and after a sputter working step, and a sputtered distance is identified from the coil currents at which the differentiated values are maximum before and after the working. In the present invention, this sputtered distance and two-dimensional images of worked surfaces are combined to produce a three-dimensional image.

DETAILED DESCRIPTION

Figure 1:
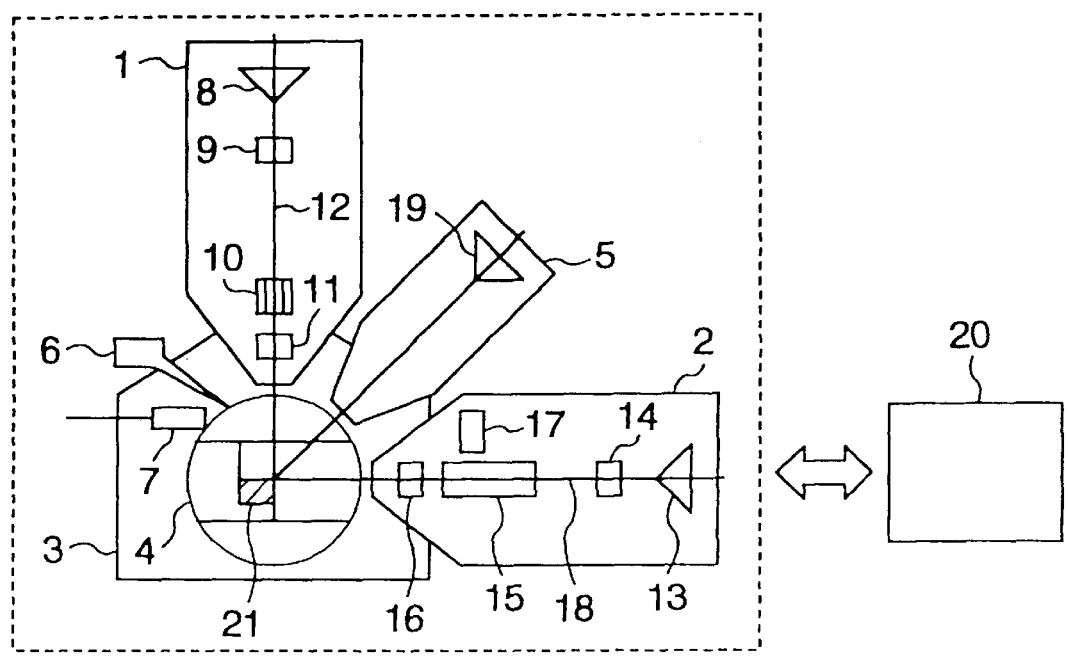
FIG. 1 block diagram illustrating the configuration of a three-dimensional observation apparatus.

The present invention will hereinafter be described in connection with an embodiment thereof. FIG. 1 illustrates the basic configuration of the present invention. Specifically, the apparatus of FIG. 1 comprises an ion column 1, an electron column 2, a specimen chamber 3, a specimen stage 4, a diluent gas ion column 5, a control system 20, and so on.

Next, an example of working and observation processing will be explained. Gallium ions produced by an ion source 8 in the ion column 1 are accelerated to 30 kV, and converged on a specimen 21 by an electrostatic converging lens 9 and an electrostatic objective lens 11. A beam formed of the ions is scanned by an electrostatic scanning electrode 10 and the control system 20. The specimen 21 is sputtered or worked by the scanning of this ion beam.

Figure 2:
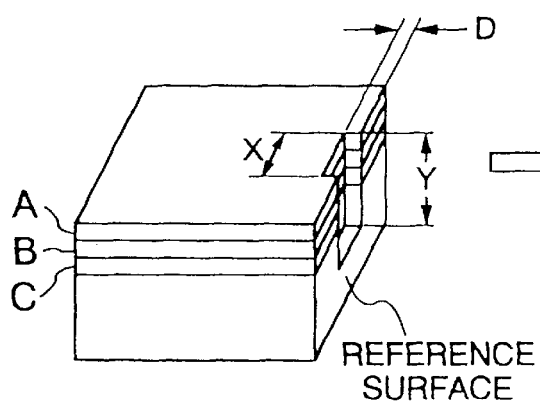
FIGS. 2(a) and 2(b) are diagrams for explaining a working direction and an observing direction.
Figure 2:
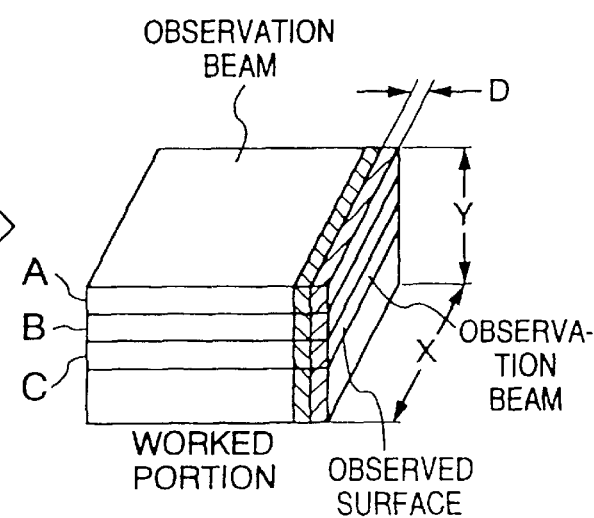
Figures 3A, 3B, 3C:
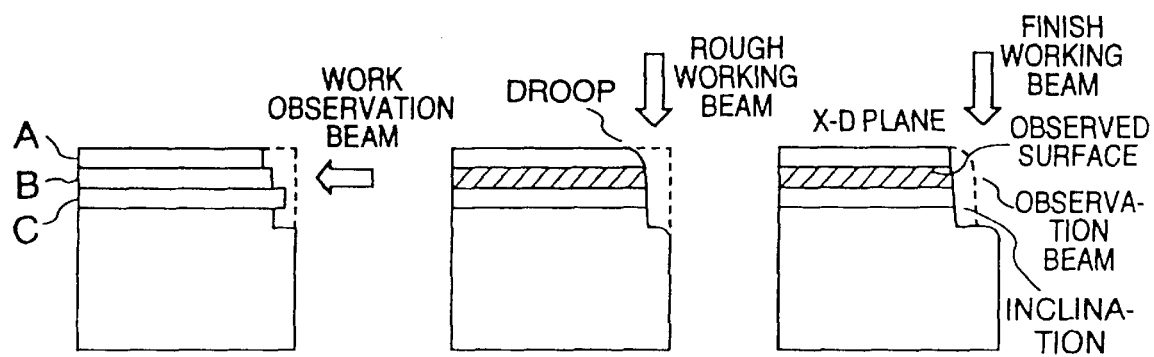
FIGS. 3(a)–3(c) are diagrams illustrating a working direction and the shape of a surface to be observed.

The specimen working step will be explained with reference to FIGS. 2(a) and 2(b). FIG. 2(a) shows a working direction in which the specimen 21 is worked, and more specifically shows the result of scanning the specimen 21 in a range defined by XxD. In other words, a range defined by XxYxD in the specimen 21 is worked. FIG. 2(b) illustrates in an enlarged view only a portion to be worked. The specimen 21 is worked on an X-D plane from the upper side of the figure, and a D-Y plane of the specimen is observed from the right of the figure. By placing the specimen such that it can be worked in the direction mentioned above, a specimen composed of different materials A, B, C, which are sputtered at different rates from each other, can be evenly worked. FIGS. 3(a)–3(c) illustrate the working direction and the observing direction in a cross-section along the D-Y plane. FIG. 3(a) illustrates an adverse influence which may occur in a conventional apparatus, and FIGS. 3(b) and 3(c) illustrate a working step and an observation step according to the present invention, respectively.

A large current beam (rough working beam) may often be used to increase a working rate. In this case, a beam distribution extends over a larger area to give rise to a droop. In such a case, a specimen may be worked with a finer beam (finish beam) to reduce the droop, as illustrated in FIG. 3(c). The surface thus worked is then observed using the electron column 2. The electron column 2 comprises an electromagnetic converging lens 14, an electromagnetic objective lens 16, an electromagnetic scanning electrode 15, a detector 17 and so on. In other words, the electron column 2 has the same configuration as a scanning electron microscope (SEM). An electron beam 18 emitted from the column 2 is scanned over the surface under observation to record a two-dimensional electronic image.

Since the electron beam 18 is irradiated substantially perpendicularly to the surface under observation, it is possible to more correctly record information on the surface under observation. Also, by positioning an observation beam source perpendicular to a working beam source, the working and recording steps can be performed without moving the specimen. This means that an observation range X-Y can be placed on a fixed coordinate system with the electron beam 18 defined as the center of the coordinate system, so that measurements of working dimensions X, Y can be easily made. In addition, even if data are captured while changing an observation scale of the SEM (the electron column 2), i.e., an observation range, the dimensions X, Y can be determined in an accuracy provided by the electron beam scanning system.

Next, a method of calculating a working dimension in the D-direction will be explained. While the dimension in the D-direction may be measured on the X-D plane illustrated in FIG. 2 using a length measuring function provided in the ion column 1, the following problems are inherent in this measurement. (1) As illustrated in FIG. 3(c), since the boundary between the X-D plane and the surface under observation is defined by the diameter of an employed ion beam, so that, strictly speaking, the boundary is not represented by a line but by a plane, it is difficult to determine which points constitute the boundary. (2) It is known that the surface under observation is not strictly orthogonal to the X-D plane but is inclined by several degrees. Due to the inclination, the dimension D changes as a function of to Y.

Figure 4:
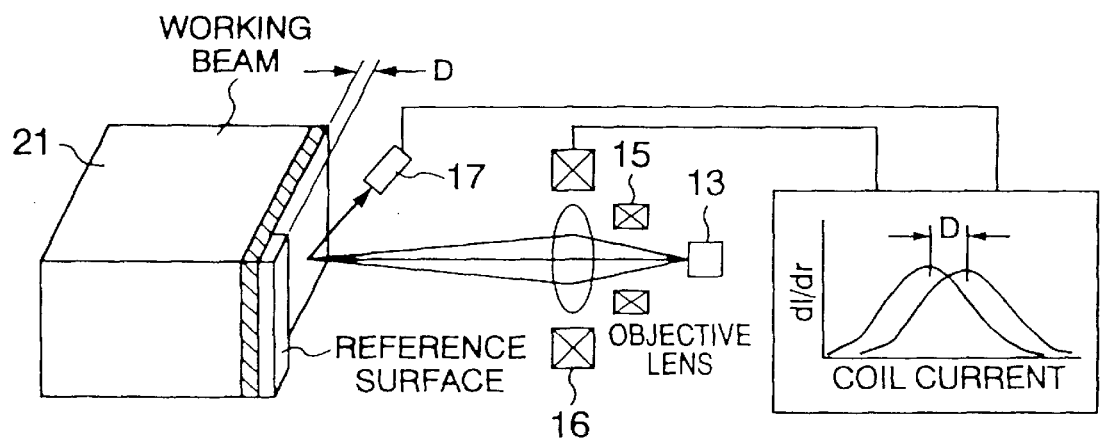
FIG. 4 is a diagram illustrating how a dimension D is measured.

To avoid the above-mentioned problems, the present invention measures the dimension D in a method represented in FIG. 4. Specifically, the distance between the specimen 21 and the objective lens can be correctly calculated from a current flowing through a coil for moving the objective lens, if the electron beam 18 is correctly converged on the specimen 21. In this event, since the naked eye cannot be fully relied on to determine whether or not the electron beam 18 is correctly converged on the specimen 21, this embodiment utilizes a differential method for this determination. More specifically, a differentiated value of a secondary electron signal is derived in the X- and Y-directions, the sum of the differentiated values over the observation area is calculated, and a correct converging point is determined to be the point at which the sum presents the largest value. This method has been conventionally known as a method of automatically finding a converging point, i.e., as an automatic focusing method. In this embodiment, a difference in the coil current is calculated between a reference point and a next surface under observation, and this difference is reduced to the dimension D.

The above-mentioned method of calculating the dimension in the D-direction provides an average dimension of a surface under observation, so that this method can be applied even if a surface under observation is inclined and an observation point is changed. In this event, for an apparently inclined surface under observation, the dimension D may be measured twice at two observation points with different Y values. Then, an inclination angle is calculated from the difference in the Y-direction between the two observation points and the difference in the dimension in the D-direction between the two measurements. By thus calculating the inclination angle, countermeasures such as repetitive working can be taken as required.

Further, the inclination angle calculated from the information on the two dimensions may be used to produce a three-dimensional image, later described.

A three-dimensional image producing means according to the present invention is provided to identify which materials compose a sputtered portion of a specimen worked with an ion beam and how a plurality of materials composing the portion are positioned.

Specific means for implementing the three-dimensional image will be described with reference to FIG. 5. Assume that in FIG. 5, a sputtering process is divided into multiple stages. Specifically, a specimen in a rectangular solid shape XxDxY is etched using an ion beam in the D-direction at arbitrary intervals to finally sputter the entire rectangular solid XxDxY. Then, during the sputtering process using the ion beam, an etched portion is observed using an electron beam to produce a two-dimensional image in the X-Y plane. The two-dimensional images produced in each of etching stages are built up in the D-direction based on the distance in the D-direction derived by the aforementioned means to finally produce a three-dimensional image. The three-dimensional image thus produced can be utilized to identify which materials are positioned in a sputtered portion in which manner. In addition, the identification of materials and a manner of composition in a sputtered portion will make such identification easier in any of the remaining portions of the specimen. Specifically, when a whole specimen under analysis has a substantially similar composition with substantially similar materials, or when a material having a particular shape is included in a sputtered portion, the identification of materials in the sputtered portion enables an operator to spontaneously understand the composition of surroundings of the sputtered portion or the composition of the whole specimen.

Figure 5:
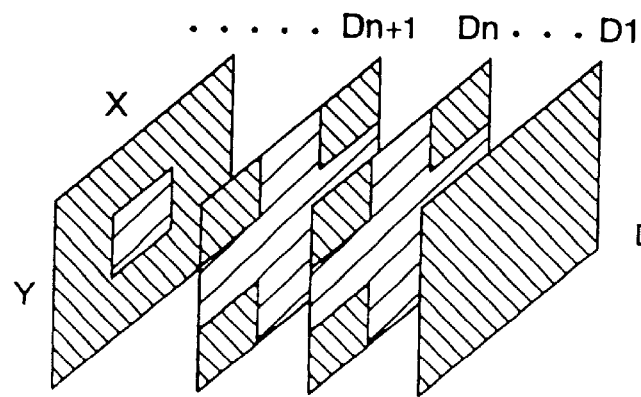
FIGS. 5(a) and 5(b) show how a three-dimensional image is produced.
Figure 5:
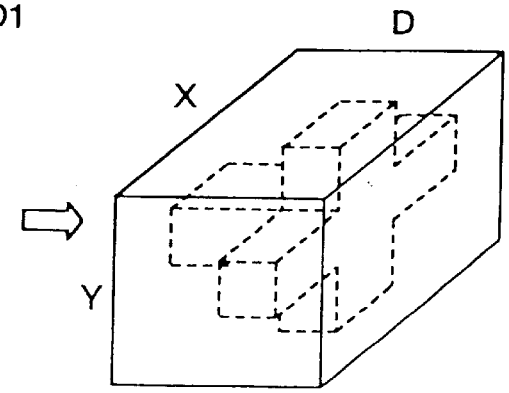

Although not shown in FIG. 5, additional steps may be provided to store a plurality of images for a single value and to arbitrarily select an appropriate image therefrom for a three-dimensional image, thus making it possible to produce the three-dimensional image intended by the operator.

Also, a plurality of two-dimensional images may be produced for each of dimensions in the D-direction depending on measuring conditions such that the produced images are classified for each of the measuring conditions and stored together with the measuring conditions. This classification of two-dimensional images will largely help produce a three-dimensional image suitable for a particular measuring condition. It will also largely help when two-dimensional images for different measuring conditions are combined to produce a three-dimensional image. In particular, the classification conveniently functions when a three-dimensional image is automatically produced, as will be later described.

A three-dimensional image (FIG. 5(b)) may be cut along an arbitrary cross-section to display an associated cross-sectional view, process information on the cross-section, and so on. Also, a plurality of such cross-sectional two-dimensional images may be advantageously displayed to analyze the structure of the specimen. Further advantageously, the two-dimensional images may be displayed simultaneously with an associated three-dimensional or solid image.

Figure 6:
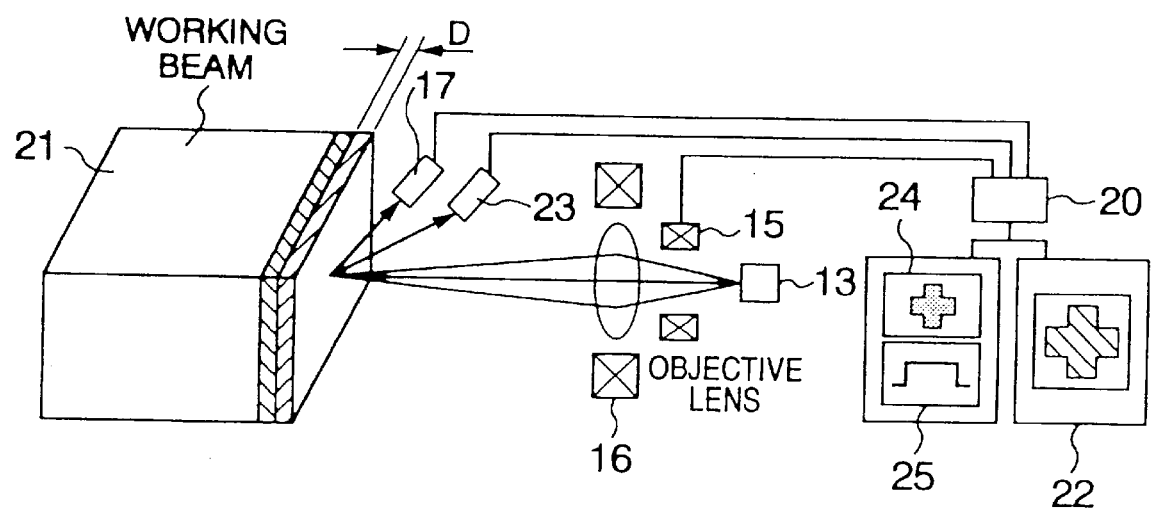
FIG. 6 is a diagram illustrating an example of a measurement using an X-ray image.

For information on a surface under observation, it is possible to record not only two-dimensional images produced by the scanning electron microscope but also information on characteristic X-rays, simultaneously with similar information on working dimensions. FIG. 6 illustrates an example of detecting X-ray information. Similar to a measurement of a SEM image 22, a detector has been previously adjusted to, for example, characteristic X-rays of aluminum. Then, an electron beam is scanned to capture information, and an element map 24 is stored together with information on working dimensions in a manner similar to that used to produce the SEM image illustrated in FIG. 5, so that a three-dimensional image is produced from this information. In this case, a solid distribution profile of aluminum in a three-dimensional region can be produced.

Next, an embodiment having a worked surface modification step between a working step and an observation step will be described with reference again to FIG. 1. Assume that the diluent gas ion column 5 in FIG. 1 is equipped with a dilute gas ion source 19. In this embodiment, argon is used as a gas for the purpose. Argon ions produced in the ion source 19 are accelerated to 2–3 kV and irradiated to the aforementioned surface to be worked. Advantageously, the diluent gas ions irradiated to the surface of the specimen remove sputtered materials, gallium for the working and, so on attached on the worked surface after a previous working step, so that a more accurate observation can be achieved. The modification to a worked surface can also be made by a dry etching method which forces a gas such as chloride having itself an etching action to directly act on a surface of a specimen, as well as the ion beam irradiation. In addition, the use of an etching promoting gas in the working, i.e., the use of gas assisted ion etching may serve to purge a worked surface. In this case, the gas, the flow rate is controlled, is supplied from a gas introducing unit 6. The modification to a worked surface may be implemented by modifying an actual surface and again observing the modified surface or by modifying fetched image information, i.e., by performing image processing. The image information thus modified is then stored for producing three-dimensional images.

The specimen stage 4 in FIG. 1 employs a side entry form. An advantage of employing the side entry stage is that the ion column 1 and the electron column 2 can be positioned as close as possible to the specimen 21, thereby improving the convergence performance of both the columns. It is also important that the side entry stage 4 is provided not only with an opening in the vertical direction of FIG. 1, i.e., in the direction facing the ion column but also with an opening in the direction facing the electronic column. This configuration enables the observation beam and the working beam to be oriented perpendicularly to each other as well as improving the resolution of images, thus increasing the accuracy of three-dimensional images produced thereby.

If the stage is made common to another SEM or TEM (transmission electron microscope) stage, a specimen worked by this apparatus can be observed by another SEM or TEM without transferring the specimen during the production of a three-dimensional image.

While the foregoing operations, i.e., working, modification to a worked surface, observation of the worked surface, measurements of dimensions of a worked portion, storage of data produced by these operations, have been manually performed, they can be automatically carried out. Since the apparatus of the present invention is controlled by a computer, only associated software needs to be modified without requiring modifications to hardware for the automatic operations. Particularly, since a long time is taken to work a specimen having a large volume in a working step, it will be a time-consuming labor for an operator. The automated operations are significant in freeing the operator from this labor. It should be noted however that changes in conditions for each image of a worked specimen are inconvenient in the automatic working process.

While the resent invention has been described in connection with specific embodiments thereof, the present invention is not limited to the foregoing embodiments, and many variations can be made without departing from the scope of the present invention. For example, an ion beam and an electron beam have been described as energy beams, a three-dimensional image may be produced only using ion beams. In this case, however, sputtering is performed during observation, so that consideration should be given in this respect. However, a two-dimensional image produced by an ion beam advantageously has a better contrast between different elements in a specimen under analysis than a two-dimensional image produced by an electron beam. Also in this case, when a two-dimensional image produced by an ion beam is observed through a mass filter, information on element distribution can also be acquired simultaneously with the two-dimensional image, as is the case of using X-rays.

As another variation, an electron column used in a transmission electron microscope (TEM) may be used as one of energy columns of the present invention. In this case, a specimen is observed using a SEM function provided in the TEM. The use of an electron column for the TEM enables information provided in the form of a TEM image to be recorded, when the specimen becomes sufficient thin, simultaneously with three-dimensional observation of the specimen. A high grade analysis can be achieved by combining such different information.

Finally, a combination of an ion beam and a laser beam may be used as an energy beam. In this case, a confocal scanning laser microscope is suitable as a laser microscope. Since the laser beam is converged by an optical lens, the position of the lens must be mechanically measured for providing the distance to a focal plane.

A surface left as it is after it has been worked using an ion beam includes worked materials redeposited thereon, scratches caused by the working, implantation of the working beam, and so on. Since these factors may often prevent good observation, the present invention solves this problem by providing means for modifying each of produced images before storing them.

According to the present invention having the configuration as described above, the following effects are realized: (1) Since correct three-dimensional information can be produced even with composite materials, it is possible to identify which materials are positioned in which manner in a specimen under analysis. (2) Since the working process includes a step of selecting an arbitrary image from a plurality of images produced under a plurality of measuring conditions in a single surface to be observed, a three-dimensional image can be produced according to the will of the operator. (3) Since a side entry stage is employed, a working column, an observation column, and a specimen under analysis can be located closer to each other, and respective beams emitted therefrom can be converged, thereby making it possible to produce highly accurate three-dimensional images. (4) Since the dimension of a sputtered portion can be measured with high accuracy, three-dimensional observation in the micron order can be achieved in a high accuracy.

What is claimed is:

1. An apparatus for working a specimen comprising:

an energy beam optical system for etching said specimen;

a charged particle optical system for irradiating said specimen with a charged particle beam;

a control system for setting optical conditions for the charged particle optical system;

a display device for displaying a specimen image based on charged particles generated due to the irradiation of said specimen with said charged particle beam; and wherein said control system includes means for specifying an interval between specimens displayed on said display device based on said optical conditions.

2. An apparatus according to claim 1, wherein said charged particle optical system includes a converging lens for converging said charged particle beam, and said control system includes means for specifying said interval between the specimens based on converging conditions of the converging lens.

3. An apparatus according to claim 2, wherein said control system includes means for differentiating, in a scanning direction, an amount of charged particle generated due to the irradiation with said charged particle beam, for calculating a converging point of said charged particle beam based on a differential value, and for specifying a current or a voltage supplied to said converging lens.

4. An apparatus according to claim 1, wherein said charged particle optical system is disposed in a perpendicular direction with respect to said energy beam optical system.

5. An apparatus according to claim 4, wherein said charged particle optical system is disposed so that a worked surface is irradiated with said charged particle beam, said worked surface being worked along an irradiation direction by said energy beam optical system.

6. An apparatus according to claim 4, wherein said specimen is supported by a specimen stage which is inserted from a perpendicular direction with respect to said charged particle optical system and said energy beam optical system.

7. An apparatus for working a specimen comprising:

an energy beam optical system for etching said specimen;

a charged particle optical system for irradiating said specimen with a charged particle beam;

a control system for setting optical conditions for the charged particle optical system;

a display device for displaying a specimen image based on charged particles generated due to the irradiation of said specimen with said charged particle beam; and wherein said display device displays a three-dimensional image of said specimen, which is constructed based on said optical conditions.

8. An apparatus according to claim 7, wherein said charged particle optical system includes a converging lens for converging said charged particle beam, and said control system includes means for specifying said interval between the specimens based on converging conditions of the converging lens.

9. An apparatus according to claim 8, wherein said control system includes means for differentiating, in a scanning direction, an amount of charged particle generated due to the irradiation with said charged particle beam, for calculating a converging point of said charged particle beam based on a differential value, and for specifying a current or a voltage supplied to said converging lens.

10. An apparatus according to claim 7, wherein said control system includes means for specifying an interval between specimens based on said optical conditions, and said display device includes means for displaying arranged specimen images of said specimen image based on said interval of the specimens.

11. An apparatus according to claim 7, wherein said display device includes means for constructing said three-dimensional image based on an arbitrary specimen image set in said control system.

12. An apparatus according to claim 7, wherein said charged particle optical system is disposed in a perpendicular direction with respect to said energy beam optical system.

13. An apparatus according to claim 12, wherein said charged particle optical system is disposed so that a worked surface is irradiated with said charged particle beam, said worked surface being worked along an irradiation direction by said energy beam optical system.

14. An apparatus according to claim 7, wherein said specimen is supported by a specimen stage which is inserted from a perpendicular direction with respect to said charged particle optical system and said energy beam optical system.

15. An apparatus for working a specimen comprising:

an energy beam optical system for etching said specimen;

a charged particle optical system for irradiating said specimen with a charged particle beam;

a control system for setting optical conditions for the charged particle optical system; and a display device for displaying a specimen image and an element distribution image based on an X-ray signal and charged particles generated due to the irradiation of said specimen with said charged particle beam, wherein said control system includes means for selecting the specimen image and the element distribution image based on said optical conditions.

16. An apparatus for working a specimen comprising:

an energy beam optical system for etching said specimen;

a charged particle optical system for irradiating said specimen with a charged particle beam;

a control system for setting optical conditions for the charged particle optical system; and a display device for displaying a specimen image based on charged particles generated due to the irradiation of said specimen with said charged particle beam, wherein said control system includes means for measuring working dimensions worked by said energy beam optical system based on said optical conditions.

17. A method for working a specimen comprising the steps of:

etching a specimen with an energy beam;

irradiating the specimen with a charged particle ray to form a specimen image based on charged particles generated due to the irradiation;

deciding an arrangement of specimen images based on optical conditions of said charged particle ray; and displaying a three-dimensional image of said specimen based on the decided arrangement of the specimen images.

18. A method according to claim 17, further comprising the step of:

modifying an etched surface of said specimen between the step of etching a specimen with an energy beam and the step of forming a specimen image.

* * * * *